(12) United States Patent
Chiang (10) Patent No.: US 8,698,484 B2
(45) Date of Patent: Apr. 15, 2014

(54) OVER-VOLTAGE AND OVER-TEMPERATURE DETECTING CIRCUIT

(75) Inventor: Chin-Tsai Chiang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 537 days.

(21) Appl. No.: 12/973,389

(22) Filed: Dec. 20, 2010

(65) Prior Publication Data

US 2011/0148395 A1 Jun. 23, 2011

(30) Foreign Application Priority Data

Dec. 22, 2009 (TW) ................................ 98144328 A (51) Int. Cl.
*G01R 19/165* (2006.01)
(52) U.S. Cl.
USPC ............... 324/104; 324/76.11; 324/750.03
(58) Field of Classification Search
CPC ............ G01R 1/04; G01R 1/30; G01R 11/04; G01R 11/60; G01R 19/84; H01L 27/248; G01D 7/05
USPC ............... 324/76.11, 103 R, 104, 115
See application file for complete search history.

(56) References Cited

U.S. PATENT DOCUMENTS

| | | | | |
|---|---|---|---|---|
| 4,002,977 A | * | 1/1977 | Sun et al. ........................ | 324/132 |
| 5,497,285 A | * | 3/1996 | Nadd ............................. | 361/103 |
| 2009/0160428 A1 | * | 6/2009 | Tai ............................... | 324/76.11 |

FOREIGN PATENT DOCUMENTS

| | | | |
|---|---|---|---|
| CN | 201440748 | * | 4/2010 |
| JP | 60-075199 | * | 4/1985 |

* cited by examiner

*Primary Examiner* — Arleen M Vazquez
*Assistant Examiner* — Robert P Alejnikov, Jr.
(74) *Attorney, Agent, or Firm* — Kirton McConkie; Evan R. Witt (57) ABSTRACT

An over-voltage and over-temperature detecting circuit includes a voltage-limiting circuit, a temperature sensing circuit, a current source, a first comparing circuit and a second comparing circuit. The equivalent resistance of the temperature sensing circuit varies with the temperature. The current source provides a first current to a detecting terminal, so that a detecting voltage is generated at the detecting terminal. By comparing the magnitude of the detecting voltage with the first reference voltage value, the first comparing circuit generates a corresponding temperature status signal. By comparing the magnitude of the detecting voltage with the second reference voltage value, the second comparing circuit generates a corresponding voltage status signal. If the temperature exceeds the temperature upper limit, the temperature status signal is in an enabling status. If the first voltage exceeds the voltage upper limit, the voltage status signal is in an enabling status.

19 Claims, 6 Drawing Sheets

FIG. 6

OVER-VOLTAGE AND OVER-TEMPERATURE DETECTING CIRCUIT

FIELD OF THE INVENTION

The present invention relates to a detecting circuit, and more particularly to an over-voltage and over-temperature detecting circuit.

BACKGROUND OF THE INVENTION

With increasing industrial development, diverse electronic devices are used to achieve various purposes. An electronic device includes a plurality of electronic components. Generally, different kinds of electronic components are operated at proper voltages and temperatures. For allowing normal operations of the electronic device, the electronic components are designed to operate at proper voltages and cooperate with proper heat sinks. Generally, the operating temperature of an electronic component increases as the ambient temperature increase. In addition, if the input voltage provided by the power supply system is abruptly increased (e.g. from a lightning stroke or activation of a motor), the electronic component is possibly operated in an over-voltage or over-temperature situation, and even the electronic component is damaged.

For preventing from abnormal operation or damage of the electronic component in the over-voltage or over-temperature situation, the electronic device is usually equipped with an over-voltage protection (OVP) circuit and an over-temperature protection (OTP) circuit to monitor the voltage and temperature of the electronic component in real time. Once the electronic component is in the over-voltage or over-temperature situation, the electronic component is instantly disabled.

Conventionally, the over-voltage protection circuit and the over-temperature protection circuit are separate and complicated circuits. The complicated configurations of over-voltage protection circuit and the over-temperature protection circuit may increase the cost and volume of the electronic device. In this circumstance, the electronic device fails to meet the small-sized requirement.

Therefore, there is a need of providing an over-voltage and over-temperature detecting circuit to obviate the drawbacks encountered from the prior art.

SUMMARY OF THE INVENTION

It is an object of the present invention to provide an over-voltage and over-temperature detecting circuit for simultaneously judging whether the operating temperature exceeds a temperature upper limit or the first voltage exceeds a voltage upper limit.

Another object of the present invention to provide an over-voltage and over-temperature detecting circuit in order to reduce the cost and volume of the electronic device.

In accordance with an aspect of the present invention, there is provided an over-voltage and over-temperature detecting circuit for judging whether a temperature exceeds a temperature upper limit or a first voltage exceeds a voltage upper limit. The over-voltage and over-temperature detecting circuit includes a voltage-limiting circuit, a temperature sensing circuit, a current source, a first comparing circuit and a second comparing circuit. The voltage-limiting circuit is interconnected between a voltage source of the first voltage and a detecting terminal for limiting and controlling the electrical energy magnitude of the first voltage to be transmitted to the detecting terminal through the voltage-limiting circuit. The temperature sensing circuit is interconnected between the detecting terminal and a common terminal. The equivalent resistance of the temperature sensing circuit varies with the temperature. The current source is connected to the detecting terminal for providing a first current to the detecting terminal, so that a detecting voltage is generated at the detecting terminal. The first comparing circuit is connected to the detecting terminal and receives a first reference voltage value. By comparing the magnitude of the detecting voltage with the first reference voltage value, the first comparing circuit generates a corresponding temperature status signal. The second comparing circuit is connected to the detecting terminal and receives a second reference voltage value. By comparing the magnitude of the detecting voltage with the second reference voltage value, the second comparing circuit generates a corresponding voltage status signal. If the temperature exceeds the temperature upper limit, the temperature status signal is in an enabling status. If the first voltage exceeds the voltage upper limit, the voltage status signal is in an enabling status.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
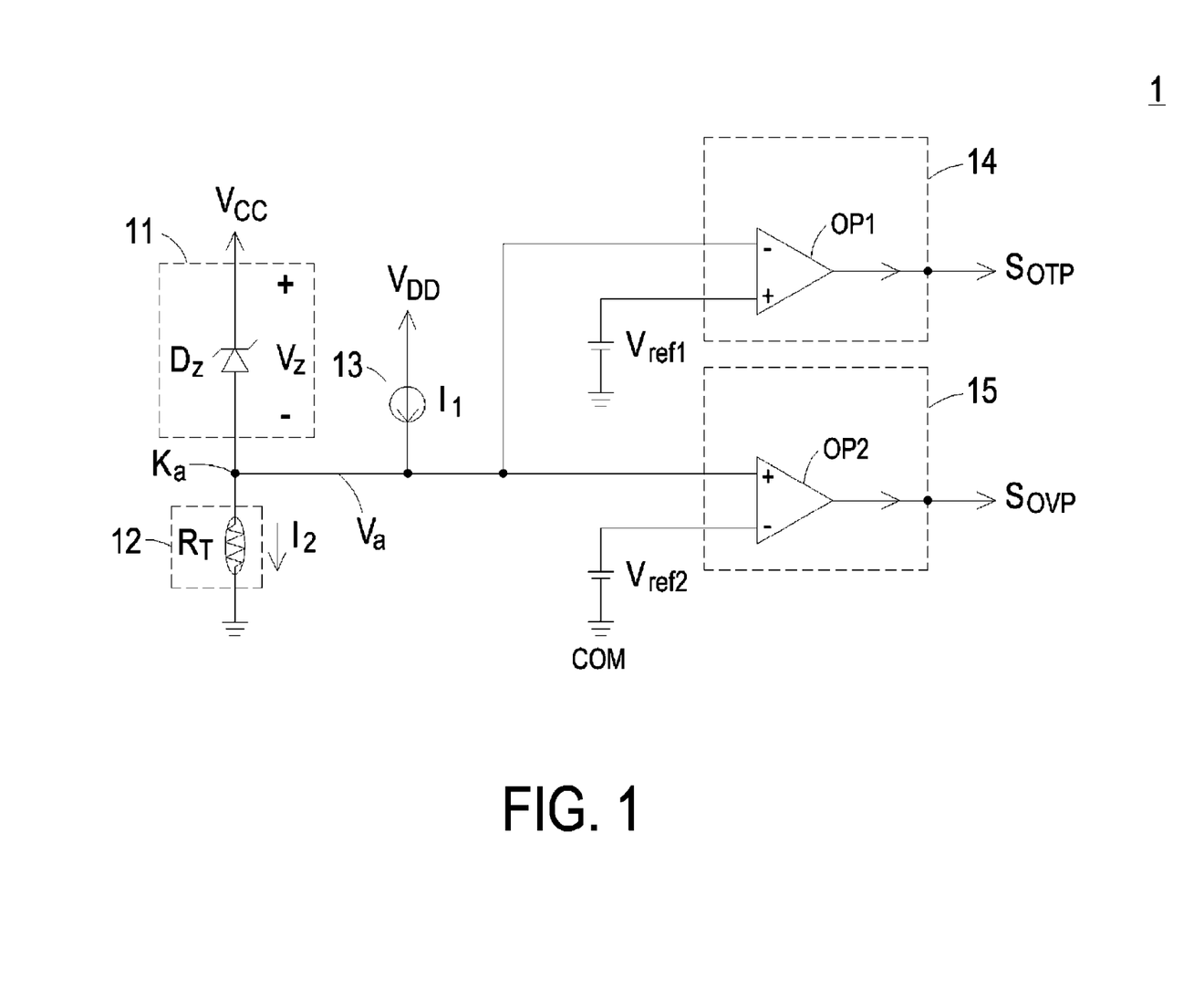
FIG. 1 is a schematic circuit diagram illustrating a first exemplary over-voltage and over-temperature detecting circuit of the present invention.

FIG. 1 is a schematic circuit diagram illustrating a first exemplary over-voltage and over-temperature detecting circuit of the present invention. As shown in FIG. 1, the over-voltage and over-temperature detecting circuit 1 is used for simultaneously monitoring an operating temperature and a first voltage $V_{cc}$, and judging whether the operating temperature exceeds a temperature upper limit or the first voltage $V_{cc}$ exceeds a voltage upper limit. The over-voltage and over-temperature detecting circuit 1 includes a voltage-limiting circuit 11, a temperature sensing circuit 12, a current source 13, a first comparing circuit 14 and a second comparing circuit 15.

In this embodiment, the voltage-limiting circuit 11 includes a Zener diode $D_z$. The Zener diode $D_z$ is interconnected between the voltage source (not shown) of the first voltage $V_{cc}$ and a detecting terminal $K_a$. The voltage-limiting circuit 11 has a limiting voltage value $V_z$. The voltage-limiting circuit 11 may limit and control the electrical energy magnitude of the first voltage $V_{cc}$ to be transmitted to the detecting terminal $K_a$.

In this embodiment, the temperature sensing circuit 12 includes a negative temperature coefficient thermister (NTC thermister) $R_T$. The NTC thermister $R_T$ is interconnected between the detecting terminal $K_a$ and a common terminal COM. The equivalent resistance of the NTC thermister $R_T$ varies with temperature.

The current source 13 is connected to the detecting terminal $K_a$ and receives the electrical energy of a second voltage $V_{DD}$, thereby generating a first current $I_1$ to the detecting terminal $K_a$. As such, a detecting voltage $V_a$ is generated at the detecting terminal $K_a$.

In this embodiment, the first comparing circuit 14 and the second comparing circuit 15 include a first operational amplifier OP1 and a second operational amplifier OP2, respectively. The positive input terminal of the first operational amplifier OP1 receives a first reference voltage value $V_{ref1}$. The negative input terminal of the first operational amplifier OP1 is connected to the detecting terminal $K_a$ to receive the detecting voltage $V_a$. By comparing the detecting voltage $V_a$ with the first reference voltage value $V_{ref1}$, the first operational amplifier OP1 outputs a corresponding temperature status signal $S_{OTP}$. The negative input terminal of the second operational amplifier OP2 receives a second reference voltage value $V_{ref2}$. The positive input terminal of the second operational amplifier OP2 is connected to the detecting terminal $K_a$ to receive the detecting voltage $V_a$. By comparing the detecting voltage $V_a$ with the second reference voltage value $V_{ref2}$, the second operational amplifier OP2 outputs a corresponding voltage status signal $S_{OVP}$.

As the temperature T increases, the resistance of the NTC thermister $R_T$ decreases. In this circumstance, the equivalent resistance of the temperature sensing circuit 12 correspondingly decreases, and the magnitude of the detecting voltage $V_a$ decreases. On the other hand, as the temperature T decreases, the resistance of the NTC thermister $R_T$ increases. In this circumstance, the equivalent resistance of the temperature sensing circuit 12 correspondingly increases, and the magnitude of the detecting voltage $V_a$ increases.

The voltage-limiting circuit 11 can limit and control the electrical energy magnitude of the first voltage $V_{cc}$ to be transmitted to the detecting terminal $K_a$ according to the limiting voltage value $V_z$. As such, the magnitude of the detecting voltage $V_a$ and a second current $I_2$ flowing into the temperature sensing circuit 12 are changed. If the first voltage $V_{cc}$ is higher than the limiting voltage value $V_z$, the electrical energy of the first voltage $V_{cc}$ is transmitted to the detecting terminal $K_a$ through the Zener diode $D_z$. As such, the magnitudes of the second current $I_2$ and the detecting voltage $V_a$ increase. Meanwhile, the difference between the detecting voltage $V_a$ and the first voltage $V_{cc}$ is equal to the limiting voltage value $V_z$. On the other hand, if the first voltage $V_{cc}$ is lower than the limiting voltage value $V_z$, the electrical energy of the first voltage $V_{cc}$ fails to be transmitted to the detecting terminal $K_a$ through the Zener diode $D_z$. Meanwhile, the magnitude of the second current $I_2$ is equal to the first current $I_1$.

Figure 2:
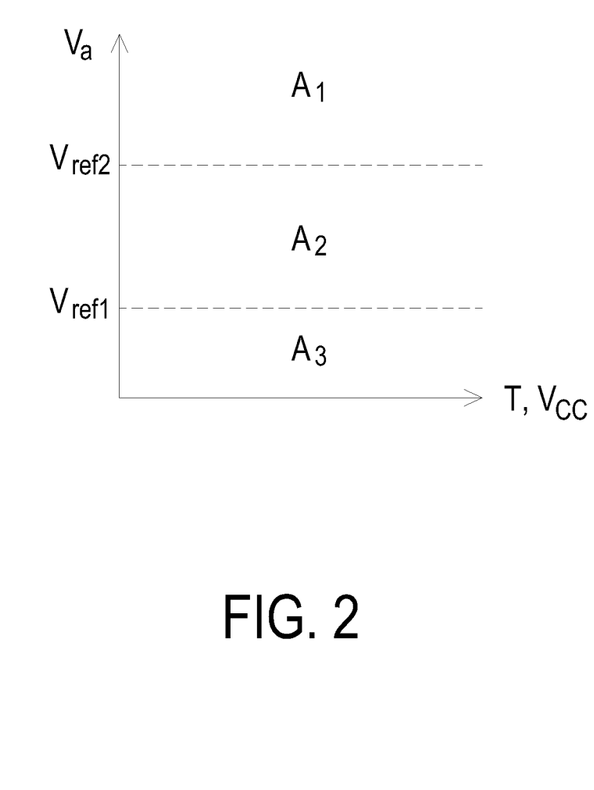
FIG. 2 is a schematic diagram illustrating the variation of the detecting voltage of the over-voltage and over-temperature detecting circuit with respect to the temperature and the first voltage according to an embodiment of the present invention.

FIG. 2 is a schematic diagram illustrating the variation of the detecting voltage of the over-voltage and over-temperature detecting circuit with respect to the temperature and the first voltage according to an embodiment of the present invention. According to the first reference voltage value $V_{ref1}$ and the second reference voltage value $V_{ref2}$, the magnitudes of the detecting voltage $V_a$ can be classified into a first zone A1, a second zone A2 and a third zone A3. In the first zone A1, the magnitude of the first voltage $V_{cc}$ exceeds the voltage upper limit. In the third zone A3, the temperature T exceeds the temperature upper limit. In the second zone A2, the temperature T is below the temperature upper limit and the magnitude of the first voltage $V_{cc}$ is below the voltage upper limit.

As the temperature T increases and exceeds the temperature upper limit, the magnitude of the detecting voltage $V_a$ is lower than the first reference voltage value $V_{ref1}$, so that the magnitude of the detecting voltage $V_a$ varies in the third zone A3. By comparing the magnitude of the detecting voltage $V_a$ with the first reference voltage value $V_{ref1}$, the temperature status signal $S_{OTP}$ outputted from the first operational amplifier OP1 is in a high-level enabling status. On the other hand, as the temperature T decreases and is below the temperature upper limit, the magnitude of the detecting voltage $V_a$ is higher than the first reference voltage value $V_{ref1}$, so that the magnitude of the detecting voltage $V_a$ is not varied in the third zone A3. By comparing the magnitude of the detecting voltage $V_a$ with the first reference voltage value $V_{ref1}$, the temperature status signal $S_{OTP}$ outputted from the first operational amplifier OP1 is in a low-level disabling status.

As the magnitude of the first voltage $V_{cc}$ increases and exceeds the voltage upper limit, the magnitude of the detecting voltage $V_a$ is higher than the second reference voltage value $V_{ref2}$, so that the magnitude of the detecting voltage $V_a$ varies in the first zone A1. By comparing the detecting voltage $V_a$ with the second reference voltage value $V_{ref2}$, the voltage status signal $S_{OVP}$ outputted from the second operational amplifier OP2 is in a high-level enabling status. On the other hand, as the magnitude of the first voltage $V_{cc}$ decreases and is below the voltage upper limit, the magnitude of the detecting voltage $V_a$ is lower than the second reference voltage value $V_{ref2}$, so that the magnitude of the detecting voltage $V_a$ is not varied in the first zone A1. By comparing the detecting voltage $V_a$ with the second reference voltage value $V_{ref2}$, the voltage status signal $S_{OVP}$ outputted from the second operational amplifier OP2 is in a low-level disabling status.

Figure 3:
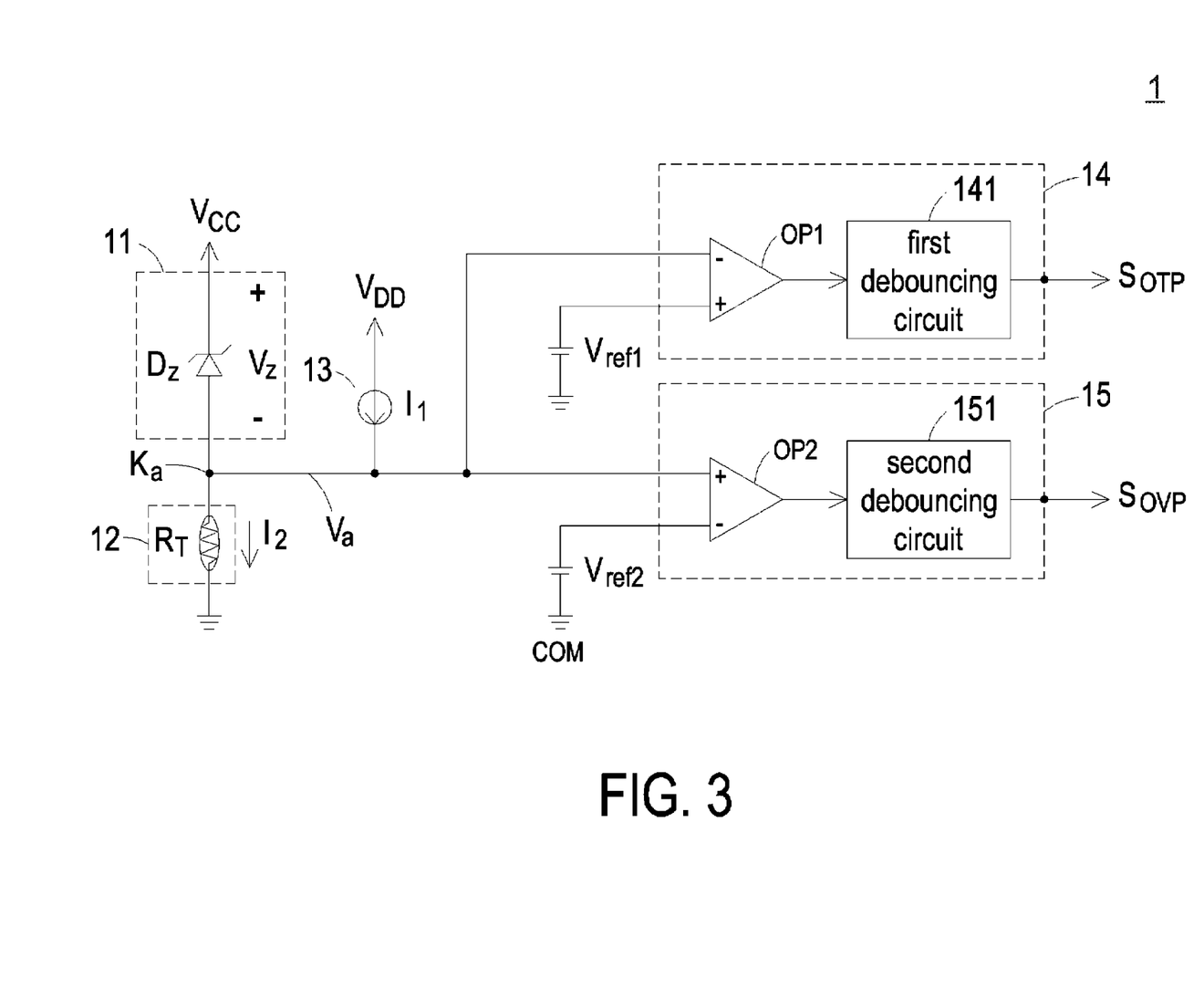
FIG. 3 is a schematic circuit diagram illustrating a second exemplary over-voltage and over-temperature detecting circuit of the present invention.

FIG. 3 is a schematic circuit diagram illustrating a second exemplary over-voltage and over-temperature detecting circuit of the present invention. In comparison with FIG. 1, the first comparing circuit 14 and the second comparing circuit 15 of the over-voltage and over-temperature detecting circuit of FIG. 3 further include a first debouncing circuit 141 and a second debouncing circuit 151, respectively. The first debouncing circuit 141 and the second debouncing circuit 151 are used for reducing the influences of noise on the temperature status signal $S_{OTP}$ or the voltage status signal $S_{OVP}$. The first debouncing circuit 141 is connected to the output terminal of the first operational amplifier OP1. The second debouncing circuit 151 is connected to the output terminal of the second operational amplifier OP2. The operating principles of the over-voltage and over-temperature detecting circuit of FIG. 3 are similar to those of FIG. 1, and are not redundantly described herein.

Figure 4A:
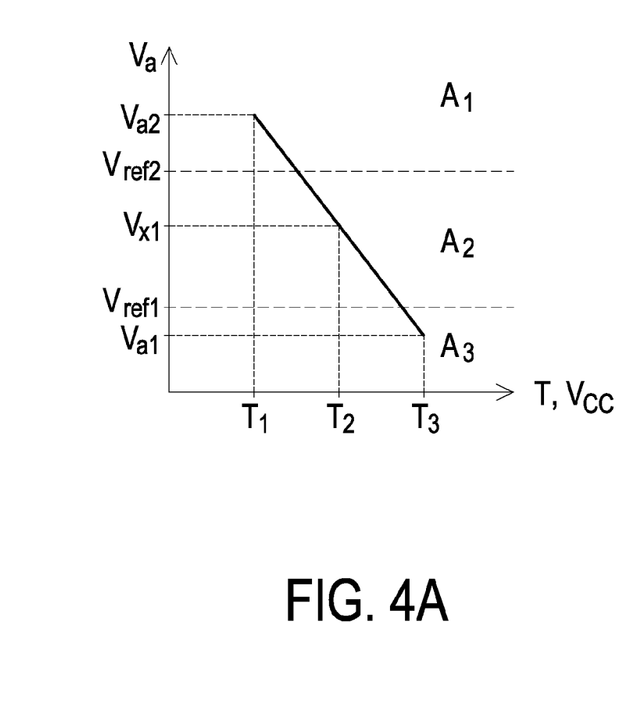
FIG. 4A is a schematic diagram illustrating the variation of the detecting voltage of the over-voltage and over-temperature detecting circuit with respect to the temperature and the first voltage according to another embodiment of the present invention.

FIG. 4A is a schematic diagram illustrating the variation of the detecting voltage of the over-voltage and over-temperature detecting circuit with respect to the temperature and the first voltage according to another embodiment of the present invention. As shown in FIG. 4A, since a third temperature $T_3$ is higher than the temperature upper limit, the equivalent resistance of the temperature sensing circuit 12 decreases. In this situation, the magnitude of the detecting voltage $V_a$ decreases to a first detecting voltage value $V_{a1}$, which is lower than the first reference voltage value $V_{ref1}$. Correspondingly, the temperature status signal $S_{OTP}$ is in the enabling status. In addition, as the temperature T decreases from the third temperature $T_3$ to a first temperature $T_1$, the equivalent resistance of the temperature sensing circuit 12 gradually increases. In this situation, the magnitude of the detecting voltage $V_a$ increases to a second detecting voltage value $V_{a2}$, which is higher than the first reference voltage value $V_{ref1}$ and the second reference voltage value $V_{ref2}$. Correspondingly, the temperature status signal $S_{OTP}$ is in the disabling status. Meanwhile, regardless of whether the first voltage $V_{cc}$ exceeds the voltage upper limit, the voltage status signal $S_{OVP}$ is in the enabling status because the second detecting voltage value $V_{a2}$ is higher than the second reference voltage value $V_{ref2}$.

Figure 4B:
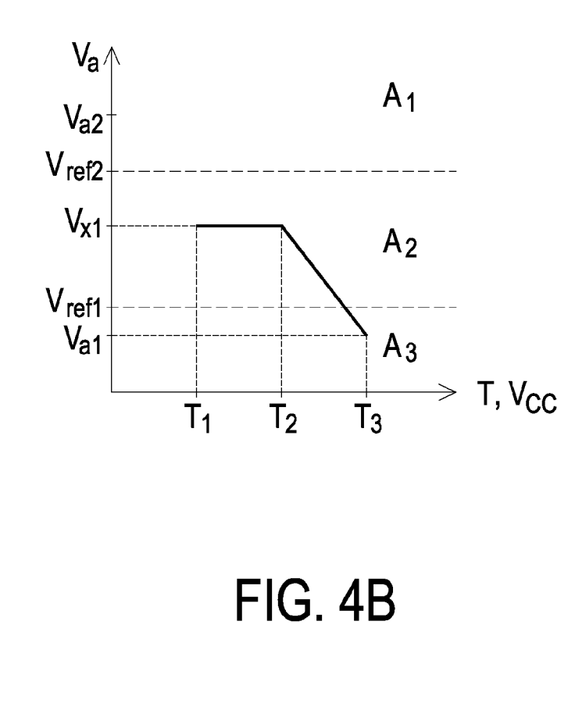
FIG. 4B is a schematic diagram illustrating the variation of the detecting voltage of the over-voltage and over-temperature detecting circuit with respect to the temperature and the first voltage according to another embodiment of the present invention.

For avoiding the above problems, the NTC thermister $R_T$ decreases needs to be properly selected, or the magnitude of the second voltage $V_{DD}$ is adjusted to a first voltage set value $V_{x1}$, which is lower than the second reference voltage value $V_{ref2}$. FIG. 4B is a schematic diagram illustrating the variation of the detecting voltage of the over-voltage and over-temperature detecting circuit with respect to the temperature and the first voltage according to another embodiment of the present invention. As shown in FIG. 4B, the magnitude of the second voltage $V_{DD}$ is adjusted to a first voltage set value $V_{x1}$ (or lower than the first voltage set value $V_{x1}$), which is lower than the second reference voltage value $V_{ref2}$. If the magnitude of the first voltage $V_{cc}$ is lower than the voltage upper limit, as the temperature T decreases to be lower than the temperature upper limit and the temperature $T_2$, the equivalent resistance of the temperature sensing circuit 12 gradually increases but the magnitude of the detecting voltage $V_a$ is maintained at the first voltage set value $V_{x1}$. Since the first voltage set value $V_{x1}$ is lower than the second reference voltage value $V_{ref2}$, the voltage status signal $S_{OVP}$ fails to be erroneously switched to the enabling status.

In some embodiments, the over-voltage and over-temperature detecting circuit 1 includes a suitable first NTC thermister $R_T$, and the magnitudes of the first voltage $V_{cc}$ and the second voltage $V_{DD}$ are identical. In some embodiments, the current source 13 is a constant current source, and the magnitude of the first current $I_1$ is constant. In accordance with the present invention, once the temperature continuously decreases to a large extent, the possibility of erroneously switching the voltage status signal $S_{OVP}$ to the enabling status will be minimized. In some embodiments, the current source 13 is a variable current source, and the magnitude of the first current $I_1$ is a variable value varying with the second reference voltage value $V_{ref2}$. As such, if the magnitude of the first voltage $V_{cc}$ is lower than the voltage upper limit, as the temperature T decreases to a large extent, the current source 13 will limit the detecting voltage $V_a$ to be lower than the second reference voltage value $V_{ref2}$. As such, the possibility of erroneously switching the voltage status signal $S_{OVP}$ to the enabling status will be minimized. In some embodiments, the current source 13 is a variable current source, and the magnitude of the first current $I_1$ is a variable value varying with the temperature T. As such, if the magnitude of the first voltage $V_{cc}$ is lower than the voltage upper limit, as the temperature T decreases to a large extent, the current source 13 will also limit the detecting voltage $V_a$ to be lower than the second reference voltage value $V_{ref2}$.

Figure 5:
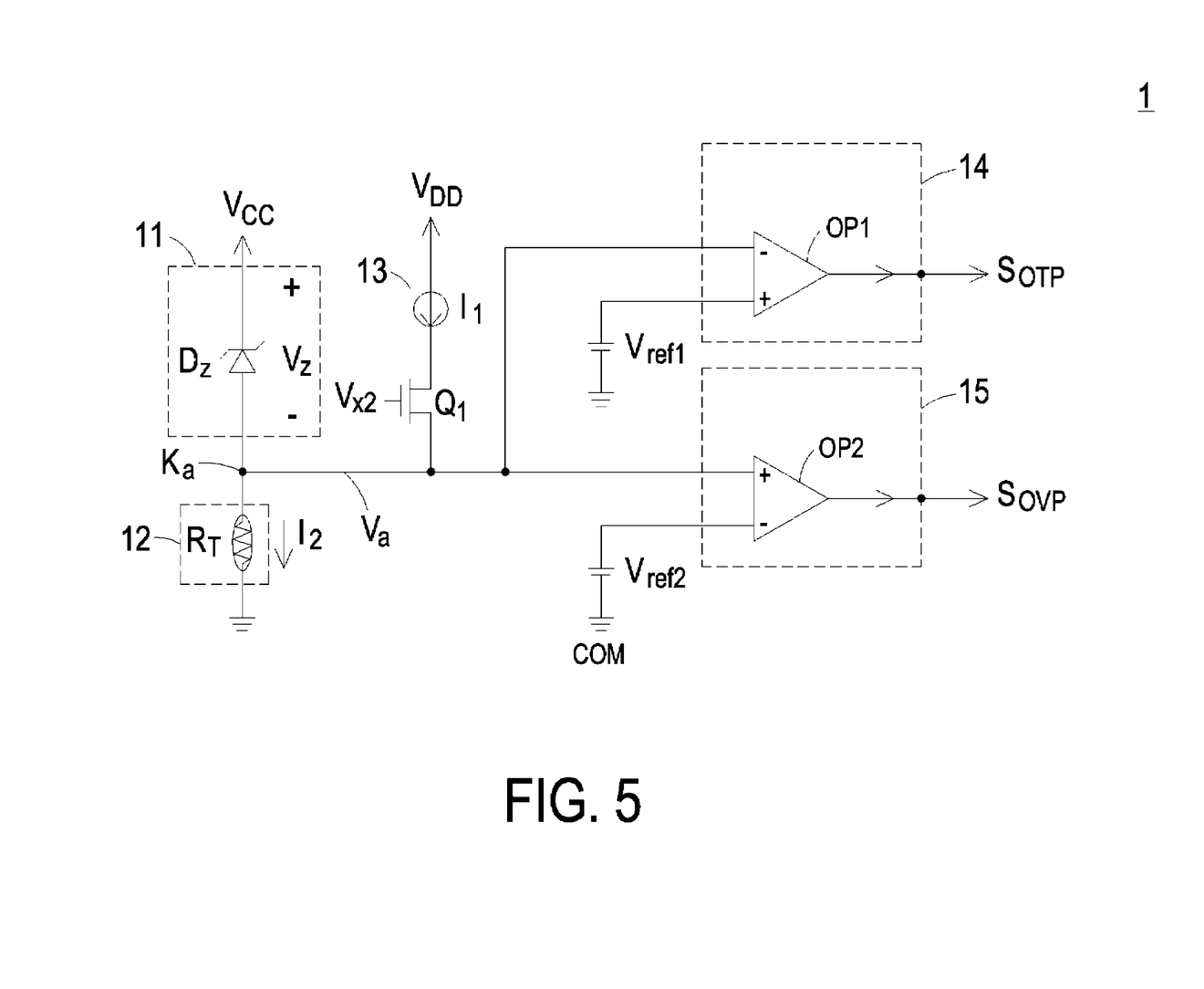
FIG. 5 is a schematic circuit diagram illustrating a third exemplary over-voltage and over-temperature detecting circuit of the present invention.

FIG. 5 is a schematic circuit diagram illustrating a third exemplary over-voltage and over-temperature detecting circuit of the present invention. In comparison with FIG. 1, the over-voltage and over-temperature detecting circuit 1 of FIG. 5 further includes a first switch element $Q_1$, which is interconnected between the detecting terminal $K_a$ and the current source 13. A second voltage set value $V_{x2}$ lower than the second reference voltage value $V_{ref2}$ is received by the control terminal of the first switch element $Q_1$. As such, the voltage difference between the control terminal of the first switch element $Q_1$ and the detecting terminal $K_a$ should not be lower than the threshold voltage value $V_{th}$ of the first switch element $Q_1$. Correspondingly, the detecting voltage $V_a$ is lower than the second reference voltage value $V_{ref2}$. As such, the possibility of erroneously switching the voltage status signal $S_{OVP}$ to the enabling status will be minimized.

In some embodiments, the second voltage set value $V_{x2}$ is lower than the difference between the second reference voltage value $V_{ref2}$ and the threshold voltage value $V_{th}$ of the first switch element $Q_1$. That is, $V_{x2} < V_{ref2} - V_{th}$. The detecting voltage $V_a$ is also lower than the second reference voltage value $V_{ref2}$. As such, as the temperature T decreases to a large extent, the possibility of erroneously switching the voltage status signal $S_{OVP}$ to the enabling status will be minimized. The operating principles of the over-voltage and over-temperature detecting circuit of FIG. 5 are similar to those of FIG. 1, and are not redundantly described herein.

Figure 6:
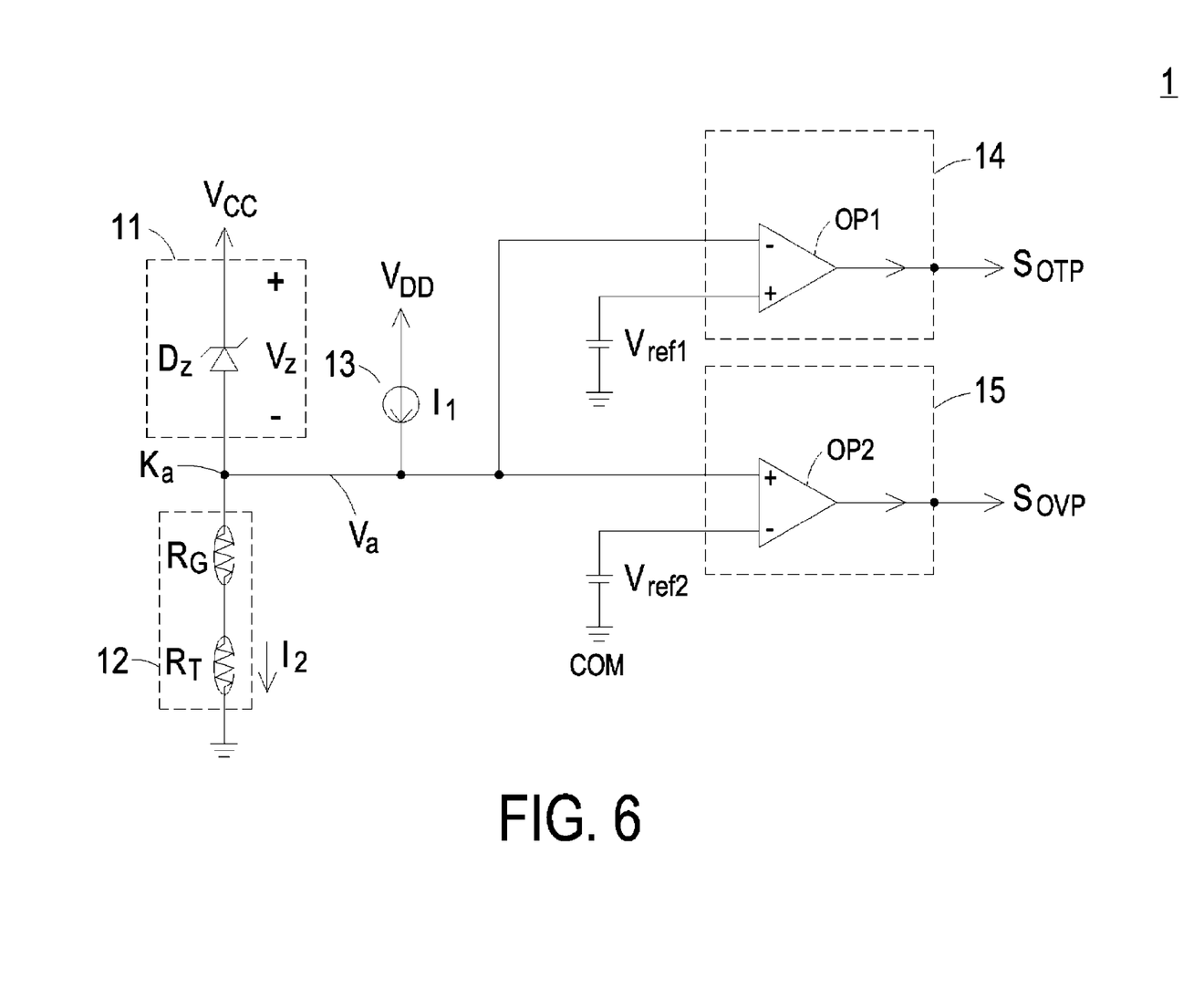
FIG. 6 is a schematic circuit diagram illustrating a fourth exemplary over-voltage and over-temperature detecting circuit of the present invention.

FIG. 6 is a schematic circuit diagram illustrating a fourth exemplary over-voltage and over-temperature detecting circuit of the present invention. In this embodiment, the temperature sensing circuit 12 includes a first NTC thermister $R_T$ and a second NTC thermister $R_G$. The first NTC thermister $R_T$ and the second NTC thermister $R_G$ are connected with each other in series. As such, the equivalent resistance of the temperature sensing circuit 12 is equal to the sum of the resistances of the first NTC thermister $R_T$ and the second NTC thermister $R_G$. If the temperature sensing circuit 12 only contains the first NTC thermister $R_T$, as the temperature T decreases to a large extent, the possibility of erroneously switching the voltage status signal $S_{OVP}$ to the enabling status will increase. In this embodiment, since the temperature coefficients of the first NTC thermister $R_T$ and the second NTC thermister $R_G$ are different, the possibility of erroneously switching the voltage status signal $S_{OVP}$ to the enabling status will be reduced. In this embodiment, the first NTC thermister $R_T$ has a larger temperature coefficient, and the second NTC thermister $R_G$ has a smaller temperature coefficient. For example, the resistances of the first NTC thermister $R_T$ are respectively 12 k Ohm and 470 k Ohm at 25° C. and 125° C. That is, for the first NTC thermister $R_T$, the resistance at 125° C. is about 40 times the resistance at 25° C. Since the first NTC thermister $R_T$ and the second NTC thermister $R_G$ are connected with each other in series, the equivalent resistances of the temperature sensing circuit 12 are respectively 212 k Ohm and 636 k Ohm at 25° C. and 125° C. That is, after the first NTC thermister $R_T$ and the second NTC thermister $R_G$ are connected with each other in series, the equivalent resistance at 125° C. is about 3 times the equivalent resistance at 25° C. The operating principles of the over-voltage and over-temperature detecting circuit of FIG. 6 are similar to those of FIG. 1, and are not redundantly described herein.

In some embodiments, the temperature sensing circuit 12 includes a single NTC thermister $R_T$ and at least one ordinary resistor. The resistance of the ordinary resistor does not vary with the temperature. Regardless of the connecting relationship between the NTC thermister $R_T$ and the at least one ordinary resistor, the equivalent resistance of the temperature sensing circuit 12 varies with the temperature. An example of the first switch element $Q_1$ includes but is not limited to a bipolar junction transistor (BJT) or a field effect transistor (FET).

From the above description, the over-voltage and over-temperature detecting circuit of the present invention is capable of simultaneously judging whether the operating temperature exceeds a temperature upper limit or the first voltage exceeds a voltage upper limit. Since the over-voltage and over-temperature detecting circuit of the present invention integrates the functions of the over-voltage protection circuit and the over-temperature protection circuit, the overall circuit is simplified, and the cost and volume of the electronic device are reduced. As a consequence, the electronic device could meet the small-sized requirement.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An over-voltage and over-temperature detecting circuit for judging whether a temperature exceeds a temperature upper limit or a first voltage exceeds a voltage upper limit, said over-voltage and over-temperature detecting circuit comprising:

a voltage-limiting circuit interconnected between a voltage source of said first voltage and a detecting terminal for limiting and controlling the electrical energy magnitude of said first voltage to be transmitted to said detecting terminal through said voltage-limiting circuit;

a temperature sensing circuit interconnected between said detecting terminal and a common terminal, wherein the equivalent resistance of said temperature sensing circuit varies with said temperature;

a current source connected to said detecting terminal for providing a first current to said detecting terminal, so that a detecting voltage is generated at said detecting terminal;

a first comparing circuit connected to said detecting terminal and receiving a first reference voltage value, wherein by comparing the magnitude of said detecting voltage with said first reference voltage value, said first comparing circuit generates a corresponding temperature status signal; and a second comparing circuit connected to said detecting terminal and receiving a second reference voltage value, wherein by comparing the magnitude of said detecting voltage with said second reference voltage value, said second comparing circuit generates a corresponding voltage status signal, wherein if said temperature exceeds said temperature upper limit, said temperature status signal is in an enabling status, and if said first voltage exceeds said voltage upper limit, said voltage status signal is in an enabling status;

wherein said voltage-limiting circuit has a limiting voltage value, and if the magnitude of said first voltage increases and is higher than a limiting voltage value, the electrical energy of said first voltage is transmitted to said detecting terminal through said voltage-limiting circuit, so that the magnitude of a second current flowing into said temperature sensing circuit and the magnitude of said detecting voltage increase.

2. The over-voltage and over-temperature detecting circuit according to claim 1, wherein if the magnitude of said first voltage is lower than said limiting voltage value, the electrical energy of said first voltage fails to be transmitted to said detecting terminal through said voltage-limiting circuit.

3. The over-voltage and over-temperature detecting circuit according to claim 1, wherein said voltage-limiting circuit comprises a Zener diode, which is interconnected to said voltage source of said first voltage and said detecting terminal for limiting and controlling the electrical energy magnitude of said first voltage to be transmitted to said detecting terminal through said voltage-limiting circuit.

4. The over-voltage and over-temperature detecting circuit according to claim 1, wherein as said temperature increases, said equivalent resistance of said temperature sensing circuit decreases, and the magnitude of said detecting voltage decreases.

5. The over-voltage and over-temperature detecting circuit according to claim 4, wherein as said temperature decreases, said equivalent resistance of said temperature sensing circuit increases, and the magnitude of said detecting voltage increases.

6. The over-voltage and over-temperature detecting circuit according to claim 4, wherein said temperature sensing circuit includes a first negative temperature coefficient thermister, which is interconnected between said detecting terminal and said common terminal.

7. The over-voltage and over-temperature detecting circuit according to claim 6, wherein said temperature sensing circuit further includes a second negative temperature coefficient thermister connected with said first negative temperature coefficient thermister in series.

8. The over-voltage and over-temperature detecting circuit according to claim 1, wherein said first comparing circuit comprises a first operational amplifier, said first operational amplifier has a positive input terminal receiving said first reference voltage value and a negative input terminal connected to said detecting terminal, and said first operational amplifier compares the magnitude of said detecting voltage with said first reference voltage value, thereby generating said temperature status signal.

9. The over-voltage and over-temperature detecting circuit according to claim 8, wherein as said temperature increases and exceeds said temperature upper limit, the magnitude of said detecting voltage is lower than said first reference voltage value, so that said temperature status signal outputted from said first operational amplifier is in said enabling status.

10. The over-voltage and over-temperature detecting circuit according to claim 8, wherein as said temperature decreases and is below said temperature upper limit, the magnitude of said detecting voltage is higher than said first reference voltage value, so that said temperature status signal outputted from said first operational amplifier is switched to a disabling status.

11. The over-voltage and over-temperature detecting circuit according to claim 8, wherein said first comparing circuit further comprises a first debouncing circuit for reducing influence of noise on said temperature status signal.

12. The over-voltage and over-temperature detecting circuit according to claim 1, wherein said second comparing circuit comprises a second operational amplifier, said second operational amplifier has a negative input terminal receiving said second reference voltage value and a positive input terminal connected to said detecting terminal, and said second operational amplifier compares the magnitude of said detecting voltage with said second reference voltage value, thereby generating said voltage status signal.

13. The over-voltage and over-temperature detecting circuit according to claim 12, wherein as said first voltage increases and exceeds said voltage upper limit, the magnitude of said detecting voltage is higher than said second reference voltage value, so that said voltage status signal outputted from said second operational amplifier is in said enabling status.

14. The over-voltage and over-temperature detecting circuit according to claim 12, wherein as said first voltage decreases and is below said voltage upper limit, the magnitude of said detecting voltage is lower than said second reference voltage value, so that said voltage status signal outputted from said second operational amplifier is switched to a disabling status.

15. The over-voltage and over-temperature detecting circuit according to claim 12, wherein said second comparing circuit further comprises a second debouncing circuit for reducing influence of noise on said voltage status signal.

16. The over-voltage and over-temperature detecting circuit according to claim 1, wherein said current source is a constant current source for receiving the electrical energy of a second voltage and generating said first current with a constant current value to said detecting terminal, and the magnitude of said second voltage is lower than said second reference voltage value.

17. The over-voltage and over-temperature detecting circuit according to claim 1, further comprising a first switch element, which is interconnected between said detecting terminal and said current source, wherein a second voltage set value is received by a control terminal of said first switch element, and said second voltage set value is lower than a difference between said second reference voltage value and a threshold voltage value of said first switch element.

18. The over-voltage and over-temperature detecting circuit according to claim 1, wherein said current source is a variable current source, and the magnitude of said first current varies with said second reference voltage value, wherein if the magnitude of said first voltage is lower than said voltage upper limit, said detecting voltage is limited to be lower than said second reference voltage value.

19. The over-voltage and over-temperature detecting circuit according to claim 1, wherein said current source is a variable current source, and the magnitude of said first current varies with said temperature, and wherein if the magnitude of said first voltage is lower than said voltage upper limit, said detecting voltage is limited to be lower than said second reference voltage value.

* * * * *